(12) United States Patent
Iijima

(10) Patent No.: US 9,178,175 B2
(45) Date of Patent: Nov. 3, 2015

(54) DISPLAY DEVICE

(71) Applicant: Panasonic Corporation, Osaka (JP)

(72) Inventor: Hiroaki Iijima, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/578,120

(22) Filed: Dec. 19, 2014

(65) Prior Publication Data

US 2015/0194626 A1   Jul. 9, 2015

(30) Foreign Application Priority Data

Jan. 8, 2014  (JP) ................................ 2014-001816

(51) Int. Cl.
| | | |
|---|---|---|
| *H01L 29/04* | (2006.01) | |
| *G06F 3/041* | (2006.01) | |
| *G09G 3/10* | (2006.01) | |
| *H01L 51/52* | (2006.01) | |
| *H01L 27/32* | (2006.01) | |

(52) U.S. Cl.
CPC ............ *H01L 51/5237* (2013.01); *H01L 27/32* (2013.01)

(58) Field of Classification Search
CPC ............................ H01L 51/5237; H01L 27/32
USPC ......... 345/173, 206; 315/291; 257/40, 59, 72, 257/88, E33.053, E33.066, E29.117, 257/E27.111, E21.414; 438/29, 30, 34
See application file for complete search history.

(56) References Cited

U.S. PATENT DOCUMENTS

| | | | |
|---|---|---|---|
| 7,595,854 B2 * | 9/2009 | Sung et al. ..................... 349/139 |
| 2003/0197475 A1 * | 10/2003 | Takamura et al. ......... 315/169.4 |
| 2004/0263740 A1 | 12/2004 | Sakakura et al. | |
| 2006/0231842 A1 * | 10/2006 | Hirakata et al. ................ 257/72 |
| 2008/0309650 A1 | 12/2008 | Nishikawa et al. | |
| 2014/0009400 A1 * | 1/2014 | Poorter et al. ................ 345/173 |

FOREIGN PATENT DOCUMENTS

| | | |
|---|---|---|
| JP | 11-142871 | 5/1999 |
| JP | 2005-038842 | 2/2005 |
| JP | 2007-086667 | 4/2007 |
| JP | 2007-115418 | 5/2007 |
| JP | 2009-020129 | 1/2009 |

* cited by examiner

*Primary Examiner* — Dao H Nguyen
(74) *Attorney, Agent, or Firm* — McDermott Will & Emery LLP

(57) ABSTRACT

In a display device according to the present disclosure, leader lines are led out from a display region to a leader region adjacent to the display region. In the leader region, metal portions are disposed between adjacent two of the plurality of leader lines with gaps. The gaps are formed between each of the metal portions and each of the adjacent two of the plurality of leader lines. A sealing layer covers display elements in the display region and covers the leader lines in a first sealing region of the leader region adjacent to the display region. A part of the sealing layer fills the gaps and adheres to each of the metal portions in the first sealing region.

18 Claims, 11 Drawing Sheets

FIG. 2
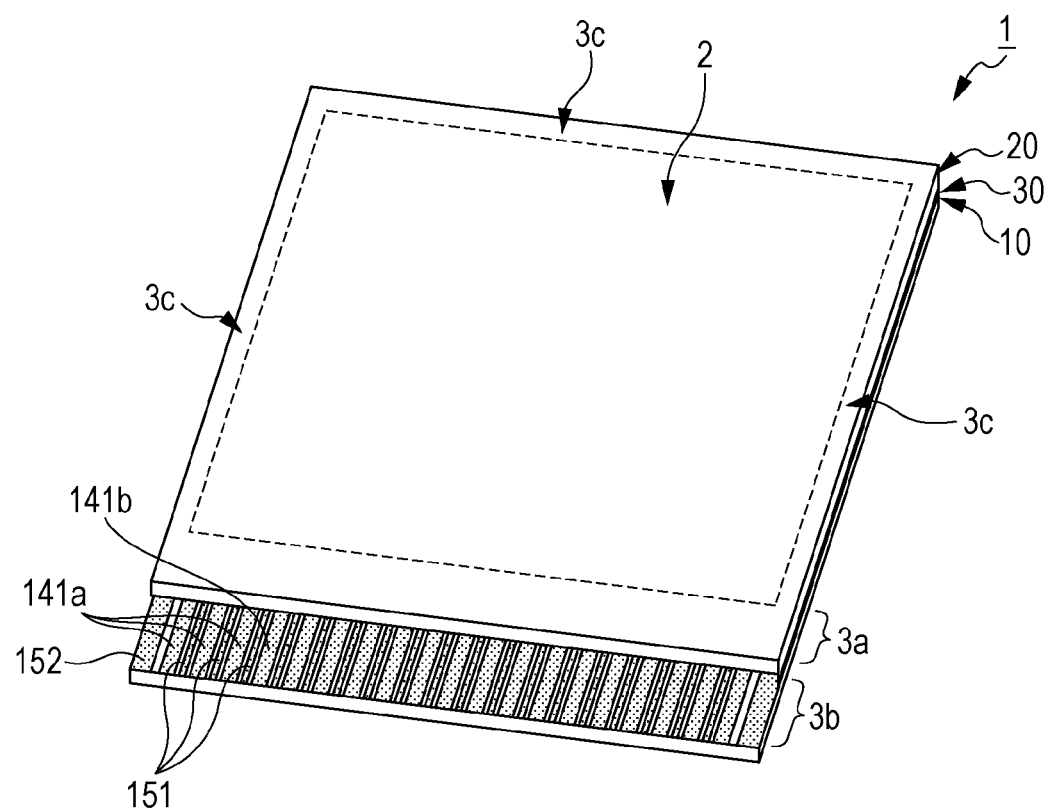
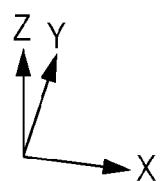

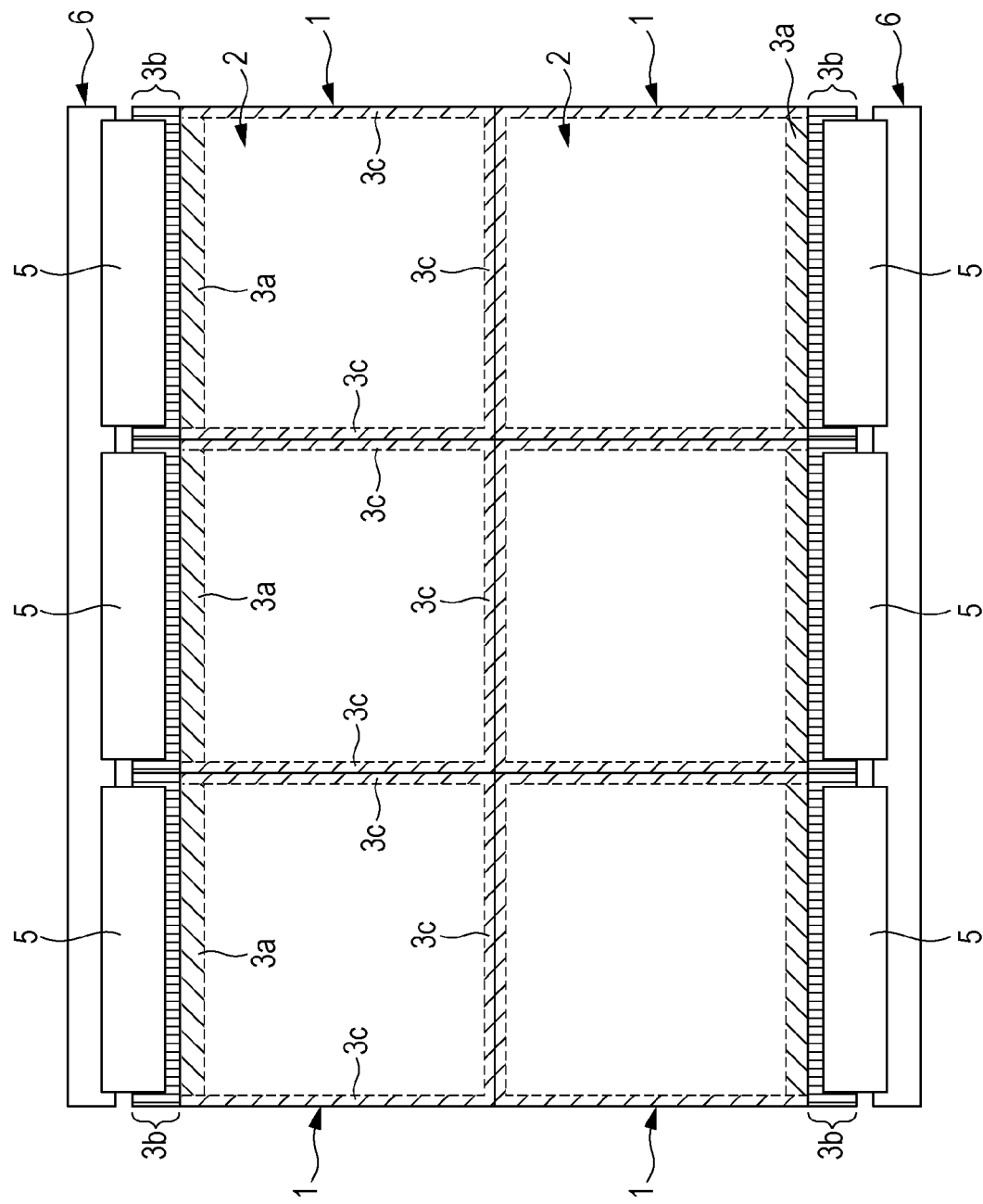

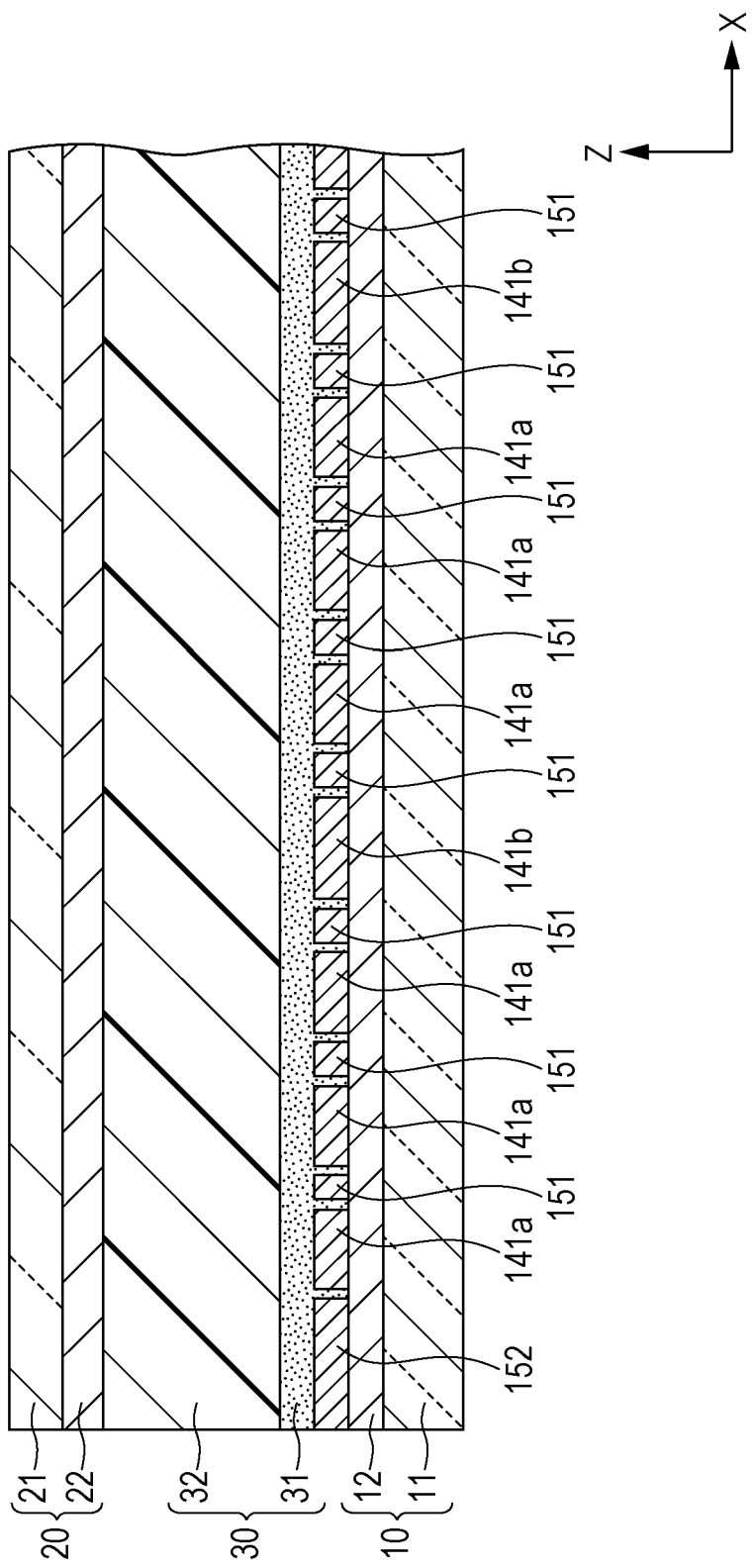

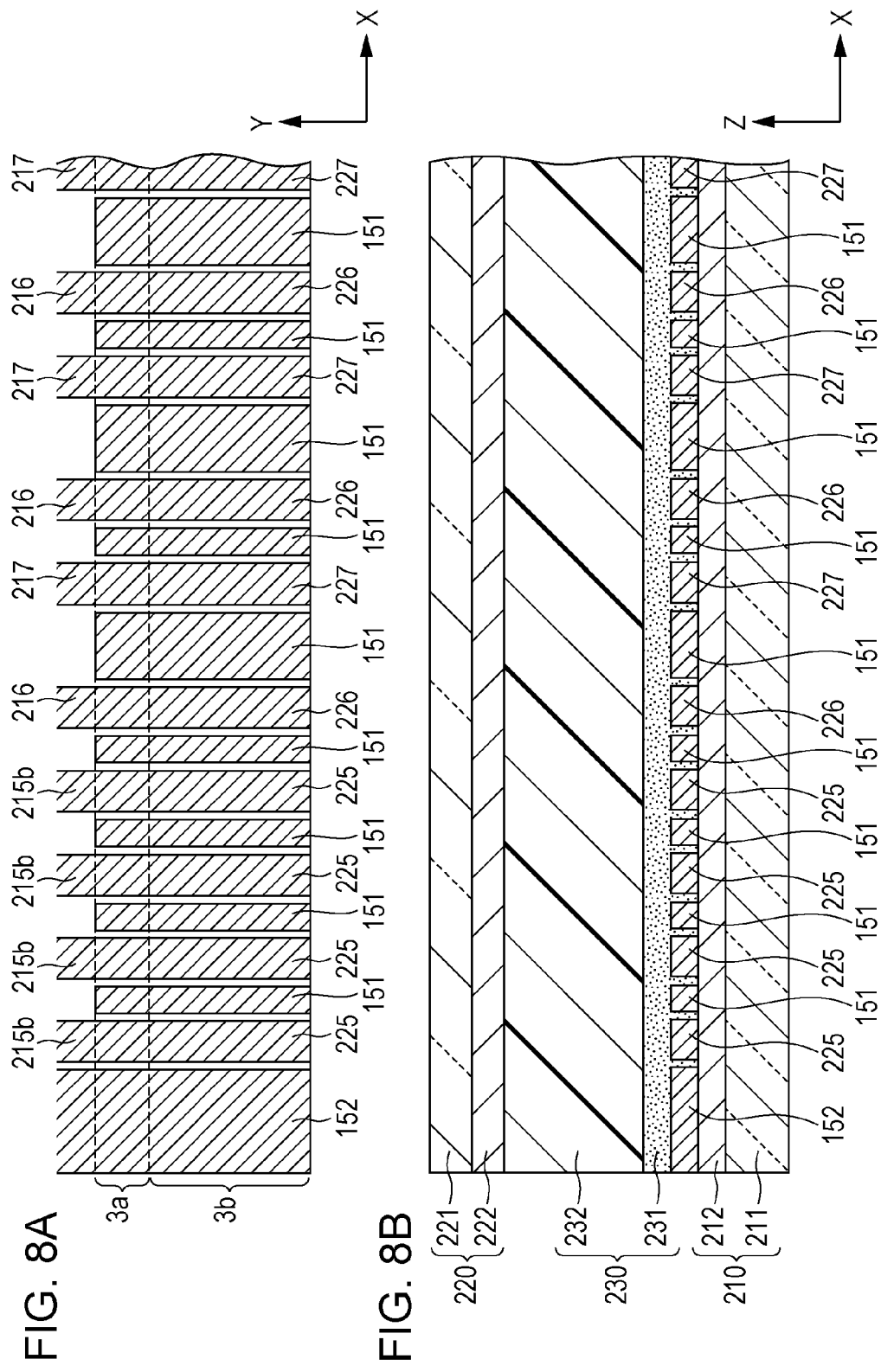

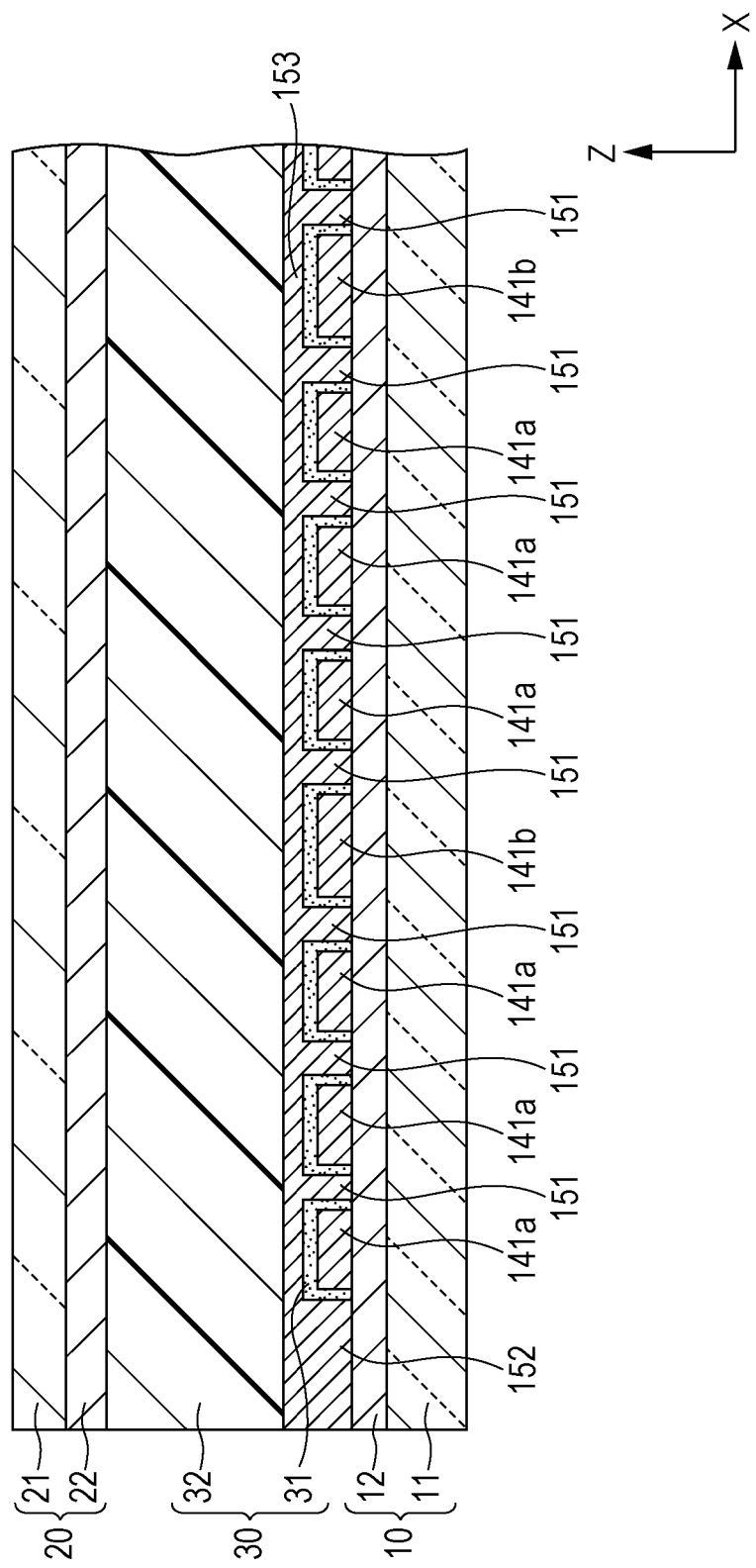

DISPLAY DEVICE

BACKGROUND

1. Technical Field

The present disclosure relates to a display device, and particularly to a display device having leader lines in a leader region in the surroundings of a display region.

2. Description of the Related Art

Flat display panels, such as a liquid crystal display and an organic electro luminescence (EL) display device, are widely used. In particular, the organic EL display device is of the self luminescent type, and thus has advantages such as not requiring backlighting, having a wide viewing angle, making it easy to reduce the thickness and power consumption of the display device, and having a high response speed. The organic EL display device is therefore attracting attention as a display to replace the liquid crystal display device.

A common organic EL display device has a structure in which a plurality of organic EL elements are arranged in matrix in a display region on a substrate and opposing substrates are disposed above and below the plurality of organic EL elements. Each of the organic EL elements has a panel structure in which a lower electrode, an organic material layer including a luminescent layer, and an upper electrode are laminated in this order.

Further, to supply a display signal and drive electric power to the plurality of organic EL elements arranged in matrix, a wiring group is disposed in the display region on the substrate. Wires of the wiring group are led out to a wiring leader region provided outside the display region, to thereby form leader lines.

Meanwhile, a material forming the organic EL elements is in general highly active and unstable, and easily reacts with moisture or oxygen in the air. If moisture or oxygen permeates a luminescent area inside the panel, therefore, characteristics of the organic EL elements deteriorate, causing a reduction in the life of the display.

In the organic EL display panel, therefore, it is necessary to seal the organic EL elements from the outside air.

As a sealing technique therefor, it is common to form a sealing film or the like to cover the plurality of organic EL elements. Further, as disclosed in Japanese Unexamined Patent Application Publication No. 2007-86667, a technique is also known which superimposes a sealing film and a sealing insulating substrate upon each other on a display region formed with a plurality of organic EL elements, and seals the space between the insulating substrate and a glass substrate with a sealing agent in a leader region in the surroundings of the display region.

SUMMARY

The present disclosure improves, in a display device such as an organic EL display device, a sealing property in parts of a leader region in the surroundings of an image display region, to which a plurality of leader lines are led out.

A display device according to one general aspect of the present disclosure includes: a first substrate; a plurality of display elements disposed on the first substrate; a plurality of leader lines led out from a display region on the first substrate, the plurality of display elements being disposed in the display region, to a leader region in surroundings of the display region, and used to input at least one of a display signal and drive electric power from outside the display device to the plurality of display elements; a sealing layer covering the plurality of display elements in the display region, and covering the plurality of leader lines and the first substrate in a first sealing region of the leader region adjacent to the display region; and a plurality of metal portions electrically separated from the plurality of leader lines, and disposed in the first sealing region between adjacent two of the plurality of leader lines with gaps that are formed between each of the plurality of the metal portions and each of the adjacent two of the plurality of leader lines, a part of the sealing layer filling the gaps and adhering to each of the plurality of the metal portions in the first sealing region.

According to the display device of the above-described embodiment, the sealing property is improved in the parts of the leader region, to which the plurality of leader lines are led out, and thereby the life of the display device is increased.

Further, since the metal portion is electrically separated from the plurality of leader lines, the occurrence of crosstalk between the plurality of leader lines is suppressed when a display signal or drive electric power is applied to the plurality of leader lines from the outside.

Additional benefits and advantages of the disclosed embodiments will be apparent from the specification and Figures. The benefits and/or advantages may be individually provided by the various embodiments and features of the specification and Figures, and need not all be provided in order to obtain one or more of the same.

BRIEF DESCRIPTION OF THE DRAWINGS

FIG. 2 is an external perspective view of the display panel according to the first embodiment;

FIG. 3 is a plan view of a tiled display having display panels joined together;

FIG. 4B is a cross sectional view of a first sealing region in the display panel according to the first embodiment;

FIG. 8A is an enlarged view of wiring in a region enclosed by broken line VIIIA in FIG. 6;

FIG. 8B is a cross sectional view of a first sealing region in the display panel according to the second embodiment;

FIG. 8C is a diagram illustrating a modified example of the sealing metal portions provided to the display panel according to the first embodiment.

DETAILED DESCRIPTION

Figure 1:
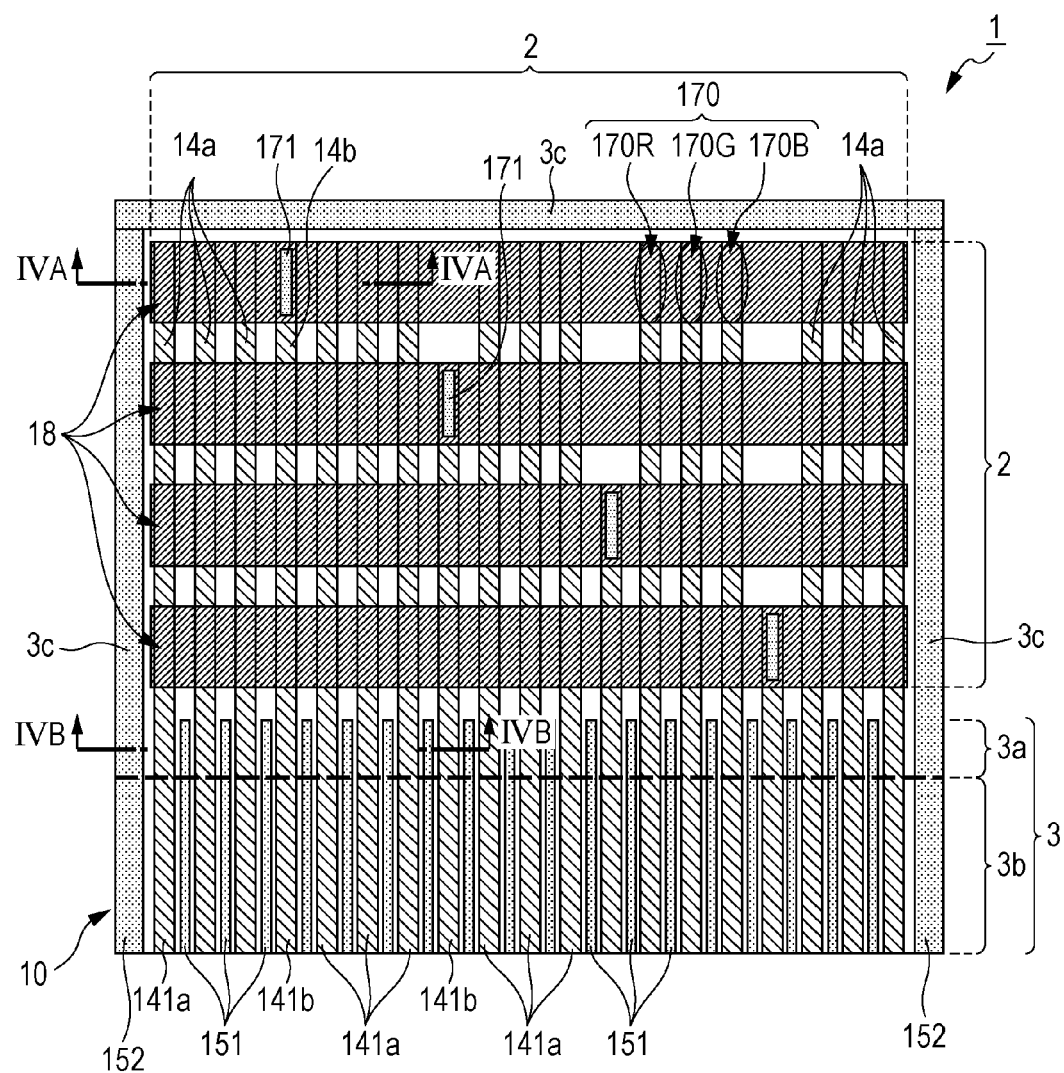
FIG. 1 is a plan view of a display panel according to a first embodiment.

Background to an Embodiment of the Present Disclosure

In a display device, the permeation of a substance acting as a failure factor, such as moisture, into a display region from parts of a region surrounding the display region, to which a plurality of leader lines are led out, is a cause of reducing the life of the display.

To increase the life of the display, therefore, it is important to have a technique of improving a sealing property in the parts of the region surrounding the display region, to which the plurality of leader lines are led out.

The present inventors have studied a method of improving the sealing property in a sealing member that seals the region surrounding the display region with a sealing layer, and consequently have found that the sealing property is improved by interposing a metal layer between the sealing layer and a substrate. The present inventors have also confirmed that such a sealing property improvement effect is obtained particularly when a portion of the sealing layer adhering to the metal layer is made of an inorganic material, such as silicon nitride.

Reasons for the improvement of the sealing property by the thus-interposed metal layer are that the adhesion between the sealing layer and the substrate is improved more when a metal layer is interposed therebetween than when the sealing layer directly adheres to the substrate, and that a metal layer generally has excellent airtightness and is highly functional in preventing the permeation of moisture and so forth.

Based on the above findings, the present inventors have assumed that the airtightness would be improved by increasing the area of metal portions interposed between the sealing layer and the substrate in the parts of the region surrounding the display region, to which the plurality of leader lines are led out.

Herein, if the metal layer is electrically connected to the leader lines in an attempt to increase the area of the metal layer interposed between the sealing layer and the substrate in the parts of the region surrounding the display region, to which the plurality of leader lines are led out, crosstalk is likely to occur between adjacent ones of the leader lines when a voltage is applied to the leader lines from the outside.

However, the present inventors have found that, if the metal portions are disposed between adjacent ones of the leader lines to be electrically separated from the leader lines, the sealing property is favorably maintained while the occurrence of crosstalk is suppressed, and consequently have realized a display device according to the present disclosure.

Embodiments of the Disclosure

A display device according to an aspect of the present disclosure includes a first substrate, a plurality of display elements, a plurality of leader lines, a sealing layer, and a plurality of metal portion. The plurality of display elements are disposed on the first substrate. The plurality of leader lines are led out from a display region on the first substrate, the plurality of display elements being disposed in the display region, to a leader region in surroundings of the display region, and used to input at least one of a display signal and drive electric power from outside the display device to the plurality of display elements. The sealing layer covers the plurality of display elements in the display region, and covering the plurality of leader lines and the first substrate in a first sealing region of the leader region adjacent to the display region. The plurality of metal portion is electrically separated from the plurality of leader lines, and disposed in the first sealing region between adjacent two of the plurality of leader lines with gaps that are formed between each of the plurality of the metal portions and each of the adjacent two of the plurality of leader lines, a part of the sealing layer filling the gaps and adhering to each of the plurality of the metal portions in the first sealing region.

According to the display device, in the first sealing region of the leader region on the side of the display region, the metal portion is disposed between adjacent two of the plurality of leader lines. With this configuration, the sealing layer adheres not only to the leader lines but also to the metal portion. Therefore, a proportion of the sealing layer adhering to a metal part including the leader lines and the metal portion is increased compared with a proportion of the sealing layer adhering to the first substrate. Accordingly, the sealing property is improved in parts of the first sealing region, to which the plurality of leader lines are led out. Thereby, the life of the display device is increased.

Further, the metal portion is electrically separated from the plurality of leader lines. When the display signal or drive electric power is applied to the plurality of leader lines from the outside, therefore, the occurrence of crosstalk between adjacent ones of the leader lines is suppressed. Herein, the metal portion may be electrically connected to a terminal that supplies a constant potential, such as a ground (earth) terminal, for example.

Further, with the metal portion disposed between adjacent two of the plurality of leader lines in the first sealing region of the leader region on the side of the display region, the adhesion of the sealing layer is higher in the first sealing region than in the display region. In the display device according to the present embodiment, therefore, the sealing property is improved toward the first sealing region from the display region. Accordingly, a failure factor such as moisture is effectively prevented from permeating the display region from the surroundings thereof.

The display device according to the above-described embodiment may be configured as follows. That is, the sealing layer in the display region and the sealing layer in the first sealing region may be the same layer. Further, in the first sealing region, at least the single metal portion may be disposed between each adjacent two of the plurality of leader lines. The metal portion may be formed at least in the first sealing region. Furthermore, when the first substrate is viewed from above, the plurality of leader lines may be disposed parallel to one another, and the metal portion may have a stripe-shape and extend parallel to the adjacent two of the plurality of leader lines. The plurality of leader lines and the metal portion may be formed in the same layer on the first substrate. Portions of the sealing layer adhering to the leader lines and the metal portion may be made of an inorganic material.

In the display device according to the above-described aspect, portions of the sealing layer covering the plurality of display elements may be made of an inorganic material. With the use of an inorganic material in the sealing layer, the sealing layer obtains favorable adhesion with the display region, the leader lines, and the metal portion. When an inorganic material is used in the sealing layer, the sealing property is improved by approximately two to four digits compared with when an organic material is used in the sealing layer. If there are a plurality of sealing layers made of an inorganic material (inorganic sealing layers) on the display elements, it is preferable that one of the plurality of inorganic sealing layers closest to the display elements adheres to the leader lines and the metal portion. If there are a plurality of inorganic sealing layers on the display elements, the sealing property for sealing the display elements is maximized when the inorganic sealing layer closest to the display elements adheres to the leader lines and the metal portion.

In the display device according to the above-described aspect, the metal portion may be electrically connected to a terminal having a constant potential. The constant potential may be supplied from a ground (earth) terminal in the display device, for example.

The display device according to the above-described aspect may include a first wiring group and a second wiring group formed to three-dimensionally cross the first wiring group, and the first wiring group and the second wiring group may be provided in the display region on the first substrate. The plurality of display elements may be formed at respective locations at which the first wiring group and the second wiring group three-dimensionally cross each other. At least one of the first wiring group and the second wiring group may be led out to the leader region in the surroundings of the display region to form the plurality of leader lines.

In the display device according to the above-described aspect, the display region may have a rectangular shape, and the plurality of leader lines may be led out from a portion of the display region corresponding to one side of display region.

The display device according to the above-described aspect may include connection wires extending parallel to the first wiring group, and the second wiring group may include wires connected to the connection wires. The plurality of leader lines may include leader lines led out from the first wiring group and leader lines led out from the second wiring group via the connection wires.

Further, in the display device according to the above-described aspect, the surroundings of the display region other than the leader region may include a second sealing region, and the display device may include a metal layer electrically separated from the plurality of leader lines and disposed on the first substrate in the second sealing region. The sealing layer may adhere to the metal layer.

The display device according to the above-described aspect may include a first wiring group and a second wiring group formed to three-dimensionally cross the first wiring group, and the first wiring group and the second wiring group may be provided in the display region on the first substrate. The plurality of display elements may be formed at respective locations at which the first wiring group and the second wiring group three-dimensionally cross each other. Further, the display device may include a driver connected to at least one of the first wiring group and the second wiring group to lead the plurality of leader lines out to the first sealing region from the driver.

The display device according to the above-described aspect may include a second substrate arranged opposite to the first substrate to cover the sealing layer. Further, the first substrate and the second substrate may be flexible. Further, each of the first substrate and the second substrate includes a substrate body formed of a plastic film, and a barrier layer formed on the upper surface of the substrate body. The barrier layer prevents moisture from permeating from the outside to the inside of the substrate body. Herein, at least a part of the barrier layer may be made of the same material as the material forming the sealing layer.

First Embodiment

An Overall Configuration of a Display Panel 1

FIG. 1 is a plan view illustrating the relation in placement among display elements and wiring in a display panel 1 according to a first embodiment. FIG. 2 is an external perspective view illustrating a configuration of the display panel 1.

In the following description, the direction indicated by arrow X in FIGS. 1 and 2 is assumed to be rightward, and the direction opposite thereto is assumed to be leftward. The direction indicated by arrow Y is assumed to be backward, and the direction opposite thereto is assumed to be frontward. In FIG. 2, the direction indicated by arrow Z is assumed to be upward from the display panel 1.

The display panel 1 is an organic EL panel for use in a passive matrix type of display device. As illustrated in FIG. 2, a first substrate 10 and a second substrate 20 are arranged opposite to each other via a sealing layer 30 to form the display panel 1. Further, the display panel 1 has a rectangular display region 2 that displays an image.

FIG. 1 illustrates a state in which a plurality of luminescent elements 170 and a wiring group extending across the luminescent elements 170 are disposed on the upper surface of the first substrate 10. As illustrated in the drawing, the plurality of luminescent elements 170 (170R, 170G, and 170B) are arranged in matrix in the display region 2 on the upper surface of the first substrate 10. The luminescent elements 170 include red luminescent elements 170R, green luminescent elements 170G, and blue luminescent elements 170B, and three adjacent luminescent elements 170R, 170G, and 170B form one pixel.

Further, on the upper surface of the first substrate 10, a plurality of lower wires 14a (a first wiring group) extending in stripe-shapes in the Y direction and a plurality of upper wires 18 (a second wiring group) extending in stripe-shapes in the X direction are disposed to three-dimensionally cross each other. Further, the above-described luminescent elements 170 are formed at respective locations at which the lower wires 14a and the upper wires 18 three-dimensionally cross each other.

Further, on the display panel 1, connection wires 14b electrically connected to the upper wires 18 are also provided parallel to the lower wires 14a, as illustrated in FIG. 1. The connection wires 14b are electrically connected to the respective upper wires 18 via the contact holes 171.

The display panel 1 includes a leader region 3 for leading out wires, which surrounds the rectangular display region 2 and is provided only on one side of the display region 2 in the direction opposite to the Y direction in FIG. 1. Leader lines 141a of the lower wires 14a and leader lines 141b of the connection wires 14b are led out to the leader region 3.

The leader region 3 is divided into a first sealing region 3a close to the display region 2 and a mount region 3b outside the first sealing region 3a. As illustrated in FIG. 2, in the first sealing region 3a, the second substrate 20 and the sealing layer 30 cover the leader lines 141a and 141b. In the mount region 3b, however, the leader lines 141a and 141b are exposed, and the exposed portions serve as terminal parts to which a display signal or drive electric power is applied from the outside.

Meanwhile, wires are not led out from a second sealing region 3c, which is a region other than the first sealing region 3a surrounding the display region 2 and corresponds to the remaining three sides (the upper side and the right and left sides) of the display region 2.

The sealing layer 30 covers the plurality of luminescent elements 170 disposed in the display region 2 on the first substrate 10. The sealing layer 30 is also formed over the plurality of leader lines 141a and 141b in the first sealing region 3a of the leader region 3 on the side of the display region 2.

The display panel 1 is suitable for a case in which a plurality of display panels 1 are tiled together. FIG. 3 is a plan view illustrating such a tiled display formed of a plurality of display panels 1 tiled together. The tiled display corresponds to a plurality of (six in FIG. 3) display panels 1 tiled together on a plane to form a single display, and is used as a large electronic signboard (digital signage), for example.

As illustrated in FIG. 3, the plurality of display panels 1 are joined together with the respective second sealing regions 3c, to which no wires are led out, connected together. The second sealing region 3c is narrower in width than the leader region 3. With the second sealing regions 3c thus connected together, therefore, video is favorably connected between adjacent ones of the display panels 1.

To drive the respective display panels 1 in the tiled display, a flexible printed circuit (FPC) 5 is connected to the mount region 3b of each of the display panels 1, as illustrated in FIG. 3.

The FPC 5 is formed of a film and a plurality of wires formed thereon. Respective one end portions of the wires of the FPC 5 are bonded by thermocompression to the leader lines 141a and 141b via an anisotropic conductive film (ACF). The respective other end portions of the wires of the FPC 5 are connected to a printed circuit board 6. The printed circuit board 6 includes drivers for supplying a voltage for driving the display panels 1.

Driving of the Display Panel 1

The display panel 1 is driven by a passive matrix driving system as follows to display the image. A data voltage and a selection voltage serving as a display signal and accompanied by drive electric power are applied to the leader lines 141a and 141b from the printed circuit board 6 via the FPC 5. The applied voltages are input to the plurality of luminescent elements 170 via the leader lines 141a and 141b.

Specifically, a data signal (a positive voltage) is selectively applied to the lower wires 14a from the plurality of leader lines 141a based on an image signal, while a selection signal (a negative voltage) is sequentially applied to the plurality of connection wires 14b from the plurality of leader lines 141b.

Thereby, a voltage signal for displaying the image is supplied to each of the luminescent elements 170, and the luminescent elements 170 emit light based on the image signal. Consequently, the image is displayed in the display region 2 of the display panel 1.

A Detailed Configuration of Respective Units in the Display Panel 1

A detailed configuration of respective units in the display panel 1 will be described below.

Figure 4A:
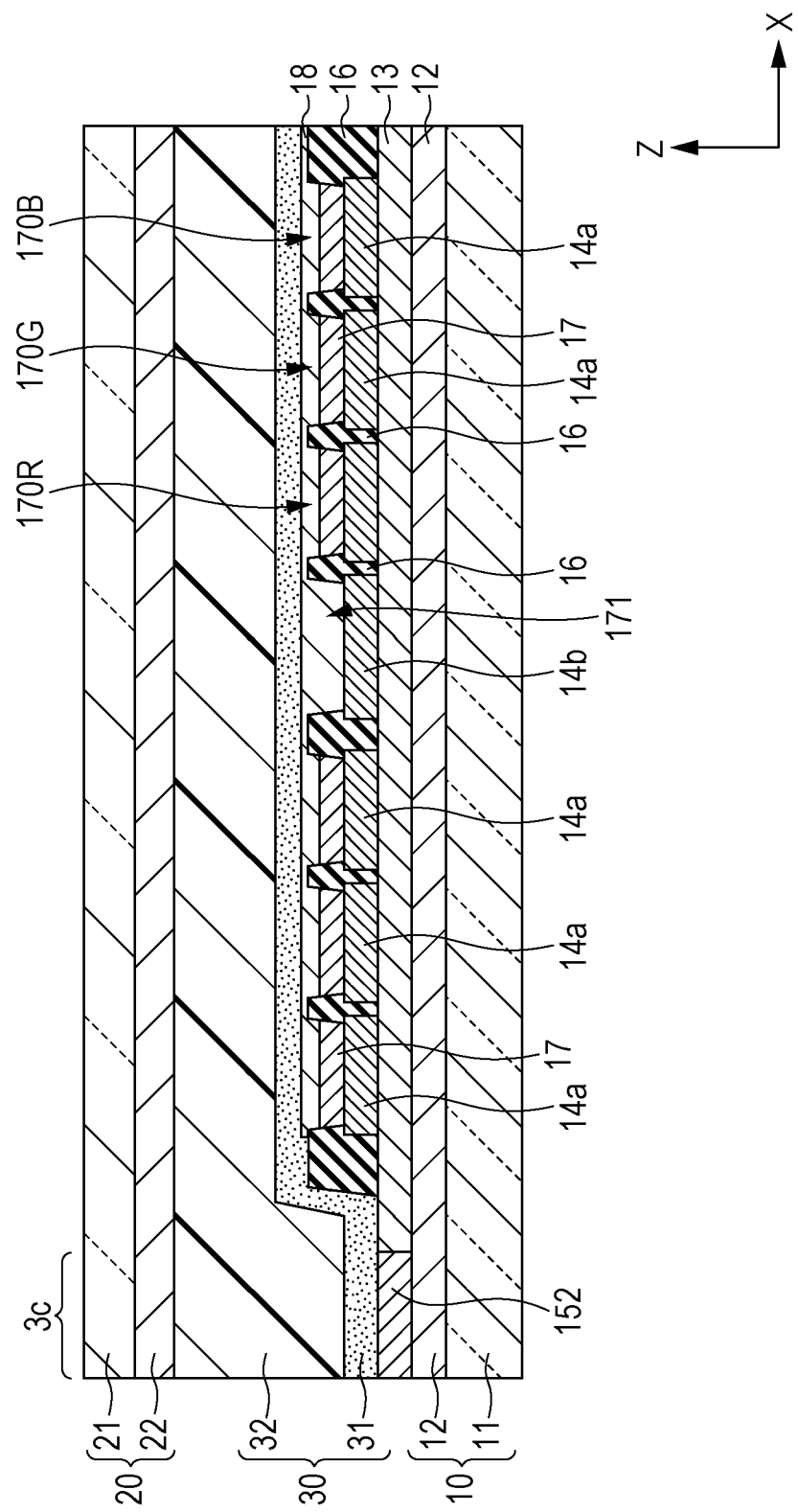
FIG. 4A is a cross sectional view of a display region in the display panel according to the first embodiment.

FIGS. 4A and 4B are cross sectional views of the display panel 1 cut along the X direction. FIG. 4A is a cross sectional view (a cross section of the display region 2) along line IVA-IVA in FIG. 1 as viewed in the direction of the corresponding arrows. FIG. 4B is a cross sectional view (a cross section of the second sealing region 3c) along line IVB-IVB in FIG. 1 as viewed in the direction of the corresponding arrows.

The First Substrate 10

The first substrate 10 includes a rectangular substrate body 11 and a first barrier layer 12 formed on the upper surface of the substrate body 11. Further, a planarization layer 13 is formed on the first barrier layer 12.

The substrate body 11 is formed of a flexible base material, such as a polyimide film or a plastic film. However, the substrate body 11 is not limited to the flexible base material, and a rigid base material such as glass may be used to form the substrate body 11.

The first barrier layer 12 is formed to prevent moisture from permeating from the outside to the inside of the substrate body 11. The first barrier layer 12 is therefore made of a material having low moisture permeability, such as silicon nitride. As well as silicon nitride, a silicon based material such as silicon oxynitride or silicon oxide, a metal thin film, or an organic material, for example, may be used to form the first barrier layer 12. A part or all of the first barrier layer 12 may be made of the same material as the material forming the sealing layer 30.

The planarization layer 13 is made of a material that enhances flatness, such as an acrylic organic material, for example. As well as such a material, an organic material such as a resist or an inorganic material such as spin on glass (SOG) may be used to form the planarization layer 13. While the first barrier layer 12 is formed on the entire substrate body 11, the planarization layer 13 is formed only in the display region 2 and not in the leader region 3.

A flexible base material is likely to allow moisture to permeate therethrough. If the substrate body 11 is made of a flexible base material, therefore, the first barrier layer 12 may be formed as described above. If a rigid base material such as glass is used to form the substrate body 11, however, the first barrier layer 12 may be omitted since the base material has low moisture permeability. Further, the planarization layer 13 may also be omitted since the glass base material has high flatness.

The Luminescent Elements 170 and the Wiring Groups

Description will be given of the luminescent elements 170 and the wiring groups provided on the above-described first substrate 10.

The plurality of lower wires 14a and the plurality of connection wires 14b extending in the aforementioned Y direction are formed in stripe-shapes on the planarization layer 13 in the display region 2. The lower wires 14a and the connection wires 14b may be made of a metal material having low resistance. The metal material includes, for example, metals such as aluminum (Al), copper (Cu), molybdenum (Mo), tungsten (W), titanium (Ti), and chromium (Cr), and alloys including these metals.

Each of the lower wires 14a and the connection wires 14b may be a single metal layer, or may have a laminated structure in which a plurality of layers are laminated. The lower wires 14a and the connection wires 14b extend from the display region 2 to the leader region 3. Portions of the lower wires 14a and portions of the connection wires 14b extending to the leader region 3 serve as the leader lines 141a and the leader lines 141b, respectively.

In the leader region 3, the planarization layer 13 is not formed, and thus the leader lines 141a and 141b are formed directly on the first barrier layer 12 (see FIG. 4B).

Further, in the leader region 3, sealing metal portions 151 are disposed between the leader lines 141a and 141b. The sealing metal portions 151 will be described in detail later.

On the planarization layer 13 in the display region 2, barriers 16 are formed in a mesh between the plurality of lower wires 14a, between the lower wires 14a and the connection wires 14b, and on the lower wires 14a and the connection wires 14b, to thereby form pixels.

The barriers 16 are made of an insulative material, specifically a polyimide-system organic material. Alternatively, the barriers 16 may be made of another organic material or an inorganic material such as silicon oxide. The barriers 16 are formed only in the display region 2 and not in the leader region 3. Further, each of the barriers 16 has a forward tapered cross section, as illustrated in FIG. 4A. Furthermore, organic layers 17 are formed in trenches between the barriers 16.

Each of the organic layers 17 includes a luminescent layer made of an organic luminescent material, and is formed of a laminate of all or parts of functional layers, such as a hole injection layer, a hole transport layer, a luminescent layer, an electron transport layer, and an electron injection layer, for example. These layers are made of an organic or inorganic material.

The upper wires 18 extending in the X direction are formed in stripe-shapes on the barriers 16 and the organic layers 17 to cross the lower wires 14a.

The upper wires 18 are made of a metal material and set to be thin to serve as transparent electrodes. The thickness of the upper wires 18 may be set to be 20 nm or less. The upper wires 18 may be made of a material other than metal, and may be a metal oxide such as indium tin oxide (ITO), for example. Further, the upper wires 18 may be made of an organic material such as poly(3,4-ethylenedioxythiophene) (PEDOT) or an inorganic material such as a nano tube. In this case, the thickness of the upper wires 18 may be 10 μm or less.

Herein, if the taper angle of each of the above-described barriers 16 is less than 90 degrees, films forming the upper wires 18 may be cut at the barriers 16 during the production of the films of the upper wires 18, failing to ensure conductivity. However, the cross section of each of the barriers 16 is forward tapered, and thus the films of the upper wires 18 are favorably formed.

As illustrated in FIG. 4A, at the locations at which the upper wires 18 and the lower wires 14a three-dimensionally cross each other, the organic layers 17 are sandwiched between the upper wires 18 and the lower wires 14a, thereby forming the luminescent elements 170.

Further, at the locations at which the upper wires 18 and the connection wires 14b three-dimensionally cross each other, the contact holes 171 are formed in the barriers 16 and the organic layers 17. The upper wires 18 and the connection wires 14b are connected via the contact holes 171.

The Sealing Layer 30: The sealing layer 30 includes a sealing film 31 covering the upper wires 18 and a resin layer 32 laminated on the sealing film 31.

The sealing film 31 may be made of an inorganic material having low moisture permeability. The inorganic material may be a silicon based material, such as silicon nitride, silicon oxynitride, or silicon oxide. The sealing film 31 may be made of a material other than inorganic materials, if the material has low moisture permeability and high adhesion with a sealing metal.

The sealing film 31 covers the display region 2 on the substrate body 11, and is formed over the leader lines 141a and 141b and the sealing metal portions 151 in the first sealing region 3a of the leader region 3 on the side of the display region 2. That is, the sealing film 31 is formed over the entire region on the substrate body 11 excluding the mount region 3b. Also in the first sealing region 3a, therefore, the sealing film 31 covers and adheres to the leader lines 141a and 141b and the sealing metal portions 151, as illustrated in FIG. 4B.

The sealing layer 30 in the display region 2 and the sealing layer 30 in the first sealing region 3a may be the same layer. With this configuration, the sealing layer covering the plurality of display elements and the sealing layer adhering to the plurality of leader lines 141a and 141b and the sealing metal portions 151 are not separated from each other. Accordingly, the sealing property is improved, and a failure factor such as moisture is effectively prevented from permeating the display region 2 from the leader region 3.

Further, with the use of the aforementioned inorganic material in the sealing film 31, the sealing film 31 obtains favorable adhesion with the display region 2, the leader lines 141a and 141b, and the sealing metal portions 151.

The sealing film 31 is also formed in the second sealing region 3c, as illustrated in FIG. 4B.

The resin layer 32 bonds the sealing film 31 and the second substrate 20 together, and covers the entire sealing film 31.

The resin layer 32 may be made of a material such as a thermoplastic epoxy resin or an ultraviolet (UV)-curable epoxy resin. As well as such a material, another material having an adhesion function and capable of preventing the permeation of moisture may be used to form the resin layer 32.

The Second Substrate 20

The second substrate 20 includes a substrate body 21 and a second barrier layer 22 stacked on the lower surface of the substrate body 21, and covers the entire region on the sealing layer 30, that is, the region on the first substrate 10 excluding the mount region 3b. The second substrate 20 is arranged opposite to the first substrate 10.

The substrate body 21 is formed of a flexible base material, which is a film made of polyimide. However, the substrate body 21 may be formed of another organic film made of polyethylene naphthalate (PEN) or polyethylene terephthalate (PET), for example. Further, the substrate body 21 is not limited to the flexible base material, and may be a glass substrate.

Similarly to the sealing film 31, the second barrier layer 22 is made of a material having low permeability, specifically silicon nitride, and has a function of preventing moisture from permeating into the panel. As well as silicon nitride, a silicon based material such as silicon oxynitride or silicon oxide, a metal thin film, or an organic material may be used to form the second barrier layer 22.

Further, if the substrate body 21 of the second substrate 20 is a glass substrate, the second barrier layer 22 may be omitted since the glass substrate has a high barrier property. In the example illustrated in FIG. 4A, the second barrier layer 22 is formed on the lower surface of the substrate body 21. However, the second barrier layer 22 may be formed on the upper surface of the substrate body 21. Further, the second barrier layer 22 may have a multilayer structure.

A Configuration of the First Sealing Region 3a and the Second Sealing Region 3c

Between the first sealing region 3a and the second sealing region 3c provided in the surroundings of the display region 2 on the display panel 1, description will first be given of a configuration of the first sealing region 3a provided with the plurality of leader lines 141a and the plurality of leader lines 141b.

As illustrated in FIG. 1 and FIG. 4B, in the leader region 3, the plurality of leader lines 141a and the plurality of leader lines 141b extending in the Y direction are formed parallel to each other, that is, in stripe-shapes, on the first substrate 10. Further, the sealing metal portions 151 electrically separated from the leader lines 141a and 141b are disposed in gaps between the leader lines 141a and gaps between the leader lines 141a and the leader lines 141b.

The plurality of sealing metal portions 151 are stripe-shaped and extend in the Y direction parallel to the leader lines 141a and 141b. Further, in order to electrically separate each of the plurality of sealing metal portions 151 from the leader lines 141a and 141b, gaps are ensured between the sealing metal portions 151 and the leader lines 141a and 141b.

Further, as illustrated in FIG. 4B, the sealing film 31 covers and adheres to the leader lines 141a and 141b and the sealing metal portions 151 in the first sealing region 3a.

Further, parts of the sealing film 31 enter and fill gaps between the leader lines 141a and the sealing metal portions 151 and gaps between the leader lines 141b and the sealing metal portions 151.

As described above, in addition to the leader lines 141a and 141b, the sealing metal portions 151 are disposed in the first sealing region 3a, and the sealing film 31 adheres to and covers the leader lines 141a and 141b and the sealing metal portions 151. Accordingly, a superior sealing property is ensured in the first sealing region 3a.

Further, in the second sealing region 3c in the region surrounding the display region 2, which corresponds to the three sides of the display region 2 other than the side of the display region 2 from which the leader lines 141a and 141b are led out, a sealing metal layer 152 is disposed on the first substrate 10. The sealing metal layer 152 is formed on the first substrate 10 to be electrically separated from the leader lines 141a and 141b. Further, as illustrated in FIGS. 4A and 4B, a rim of the sealing film 31 adheres to and covers the sealing metal layer 152.

The sealing metal portions 151 and the sealing metal layer 152 may be formed simultaneously with the leader lines 141a and 141b, that is, formed in the same layer as that of the leader lines 141a and 141b, with the same material as the material forming the leader lines 141a and 141b.

As to electrical connection of the sealing metal portions 151 and the sealing metal layer 152 when the display device is in use, the sealing metal portions 151 and the sealing metal layer 152 may serve as floating electrodes, without being electrically connected to the other components. Alternatively, the sealing metal portions 151 and the sealing metal layer 152 may be connected to ground or a constant potential close to ground.

As a method of connecting the sealing metal portions 151 and the sealing metal layer 152 to ground, the FPC 5 may be provided with wiring for connecting the sealing metal portions 151 and the sealing metal layer 152 to a ground line, for example.

Description will now be given of the second sealing region 3c corresponding to the three sides of the display region 2 other than the side of the display region 2 from which the leader lines 141a and 141b extend, as illustrated in FIG. 4B.

In the second sealing region 3c, the sealing metal layer 152 is disposed on the first substrate 10, and the rim of the sealing film 31 adheres to and covers the sealing metal layer 152. With the sealing metal layer 152 thus disposed to adhere to the sealing film 31, the sealing property is also improved in the second sealing region 3c.

A Sealing Property Improvement Effect in the First Sealing Region 3a and the Second Sealing Region 3c

As described above, that the sealing property is improved in the first sealing region 3a and the second sealing region 3c is based on the finding that the sealing property is improved more when a sealing film made of silicon nitride or the like and a substrate adhere to each other with a metal layer interposed therebetween than when the sealing film and the substrate directly adhere to each other, as described in Background to an Embodiment of the Present Disclosure.

The sealing property improvement effect will be described by comparing an embodiment example with comparative examples.

Figure 5A:
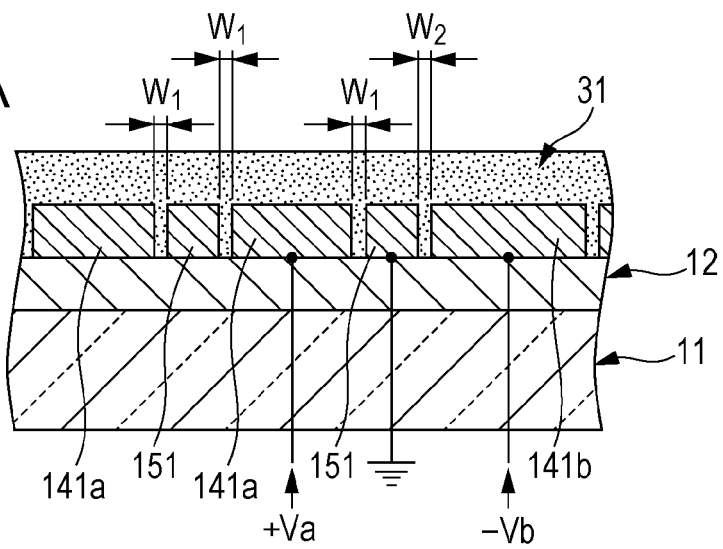
FIGS. 5A to 5C are cross sectional views illustrating a sealing property improvement effect obtained by providing sealing metal portions in the first sealing region.
Figure 5B:
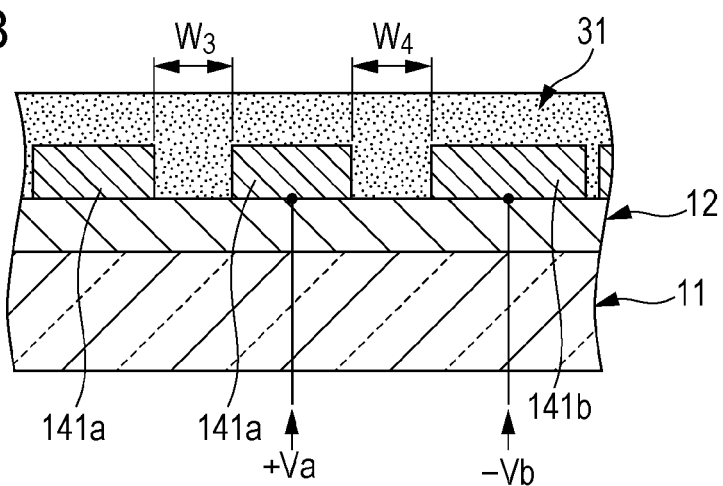
Figure 5C:
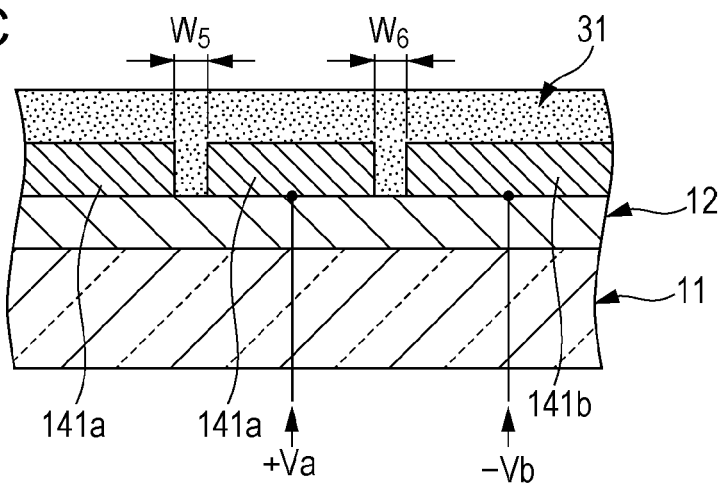

FIGS. 5A, 5B, and 5C are cross sectional views illustrating the sealing property improvement effect obtained by providing the sealing metal portions 151 in the first sealing region 3a. FIG. 5A relates to an embodiment example, and FIGS. 5B and 5C relate to a first comparative example and a second comparative example, respectively.

In the embodiment example illustrated in FIG. 5A, the sealing metal portions 151 are disposed between the leader lines 141a and between the leader lines 141a and the leader lines 141b, and the sealing film 31 adheres to and covers the leader lines 141a and 141b and the sealing metal portions 151. Further, parts of the sealing film 31 enter and fill gaps between the leader lines 141a and the sealing metal portions 151 (gaps W1) and gaps between the leader lines 141b and the sealing metal portions 151 (gaps W2).

Meanwhile, in the first comparative example illustrated in FIG. 5B, the sealing metal portions 151 are not disposed between the leader lines 141a (gaps W3) and between the leader lines 141a and the leader lines 141b (gaps W4), and parts of the sealing film 31 fill the entirety of these gaps (gaps W3 and W4).

In the embodiment example in FIG. 5A, the width of a gap (W1+W2) is narrower than that of each of the gaps in the first comparative example (gap W3 or W4) by the width of the sealing metal portion 151. That is, the area of metal layers interposed in the first sealing region 3a is larger in the embodiment example in FIG. 5A than in the first comparative example in FIG. 5B by the area occupied by the sealing metal portions 151.

Herein, according to the aforementioned finding, the sealing property is improved in the first sealing region 3a with the increase in the area of metal layers interposed between the sealing film 31 and the first substrate 10, that is, with the increase in the length in the X direction of the leader lines 141a and 141b and the sealing metal portions 151. In the embodiment example, therefore, the sealing property in the first sealing region 3a is improved more than in the first comparative example.

The second comparative example in FIG. 5C will now be described. In the second comparative example, the sealing metal portions 151 are not interposed between the leader lines 141a and between the leader lines 141a and the leader lines 141b, and the electrode width (length in the X direction) of the leader lines 141a and 141b is set to be greater than that in the embodiment example. Therefore, gaps between the leader lines 141a (gaps W5) and gaps between the leader lines 141a and the leader lines 141b (gaps W6) are narrower than the gaps in the first comparative example (gaps W3 and W4).

Also in the second comparative example, the length in the X direction of the leader lines 141a and 141b is greater than that in the first comparative example. Therefore, a function of cutting off moisture and gases is enhanced, and the sealing property is improved. If the gaps W5 between the leader lines 141a and the gaps W6 between the leader lines 141a and the leader lines 141b are narrow as in the second comparative example, however, crosstalk is likely to occur in these gaps when the display panel 1 is driven.

In particular, crosstalk is likely to occur between the leader lines 141a and the leader lines 141b when the display panel 1 is driven, since voltages of opposite polarities are applied to the leader lines 141a and the leader lines 141b. That is, when a data voltage (positive voltage +Va) is applied to the leader lines 141a and a scanning voltage (negative voltage −Vb) is applied to the leader lines 141b of the connection wires 14b, a voltage (Va+Vb) is applied between the leader lines 141a and the leader lines 141b (gaps W6). If the gaps W6 between the leader lines 141a and the leader lines 141b are narrow, therefore, crosstalk is likely to occur between the leader lines 141a and the leader lines 141b.

In the embodiment example, however, a sufficient distance is ensured between each of the leader lines 141b and any of the leader lines 141a adjacent thereto, and the sealing metal portion 151 interposed between the leader line 141a and the leader line 141b is not electrically connected to the leader line 141a or the leader line 141b. Therefore, crosstalk is unlikely to occur between the leader line 141a and the leader line 141b when the display panel 1 is driven. Further, in the embodiment example, the sealing metal portions 151 are also disposed in the gaps between the leader lines 141a. This configuration also makes it possible to obtain the sealing property improvement effect while suppressing crosstalk.

In FIG. 5A, the sealing metal portions 151 are connected to ground. Even if the sealing metal portions 151 are not electrically connected to the other components, however, crosstalk is still unlikely to occur between the leader lines 141a and the leader lines 141b.

As understood from the foregoing comparison with the first and second comparative examples, the embodiment example is capable of improving the sealing property while suppressing the occurrence of crosstalk.

Each of sealing metal portions 151 electrically separated from the leader lines 141a and 141b may be disposed on the first substrate 10 (on the first barrier layer 12 in FIG. 5A) in the first sealing region 3a between adjacent two of the leader lines 141a and 141b with a gap formed between the sealing metal portion 151 and each of the adjacent two of the leader lines 141a and 141b. With this configuration, the sealing film 31 (the sealing layer 30) adheres not only to the leader lines 141a and 141b but also to the sealing metal portions 151. Therefore, a proportion of the sealing film 31 adhering to a metal part including the leader lines 141a and 141b and the sealing metal portions 151 is increased compared with a proportion of the sealing film 31 adhering to the first substrate 10 (the first barrier layer 12 in FIG. 5A). Accordingly, the sealing property is improved, and thereby the life of the display device is increased.

Further, with the sealing metal portions 151 disposed between adjacent ones of the plurality of leader lines 141a and 141b in the first sealing region 3a, the adhesion of the sealing film 31 (the sealing layer 30) is higher in the first sealing region 3a than in the display region 2. In the display device according to the embodiment example, therefore, the sealing property is improved toward the first sealing region 3a from the display region 2. Accordingly, a failure factor such as moisture is effectively prevented from permeating the display region 2 from the first sealing region 3a.

Width and Shape of the Sealing Metal Portions 151

The width (length in the X direction) of the sealing metal portions 151 may be set such that each of the gaps W1 between the leader lines 141a and the sealing metal portions 151 and the gaps W2 between the leader lines 141b and the sealing metal portions 151 ranges from 1 μm to 5 μm. In the example illustrated in FIG. 1, each of the sealing metal portions 151 has a rectangular stripe-shape. However, the sealing metal portion 151 may have a round insular shape, such as a circular, oval, or elliptical shape, for example.

Further, in the example illustrated in FIG. 1, one sealing metal portion 151 is disposed in each of the gaps between the leader lines 141a and the gaps between the leader lines 141a and the leader lines 141b. However, the number of sealing metal portions 151 disposed in each of these gaps may be two or more.

With this configuration, the sealing layer 30 alternately adheres to the leader lines 141a and 141b and the sealing metal portions 151 in the first sealing region 3a. Therefore, the proportion of the sealing layer 30 adhering to the leader lines 141a and 141b and the sealing metal portions 151 is further increased compared with the proportion of the sealing layer 30 adhering to the first substrate 10. Accordingly, the sealing property is improved, and thus the life of the display device is increased.

Further, for example, a plurality of insular shaped sealing metal portions 151 may be arranged in the Y direction in each of the gaps between the leader lines 141a and the gaps between the leader lines 141a and the leader lines 141b.

The sealing metal portions 151 may be formed at least in the first sealing region 3a, and are not required to extend to the mount region 3b as illustrated in FIG. 1. With the sealing metal portions 151 formed at least in the first sealing region 3a, a failure factor such as moisture is effectively prevented from permeating the display region 2 from the surroundings thereof.

A Manufacturing Method for the Display Panel 1

The first barrier layer 12 is first formed on the substrate body 11, to thereby produce the first substrate 10. Further, the second barrier layer 22 is formed on the lower surface of the substrate body 21 separately prepared, to thereby produce the second substrate 20.

Subsequently, the planarization layer 13 is formed on the first barrier layer 12 of the first substrate 10.

Then, the plurality of lower wires 14a and the plurality of connection wires 14b are formed parallel to each other (in stripe-shapes) on the planarization layer 13 from the display region 2 to the leader region 3. In this step, the leader lines 141a and 141b are simultaneously formed. Further, the sealing metal portions 151 are formed in the leader region 3, and the sealing metal layer 152 is formed in the second sealing region 3c. These components may be formed by sputtering or the like with a metal (aluminum, for example).

Herein, if the lower wires 14a, the connection wires 14b, the sealing metal portions 151, and the sealing metal layer 152 are simultaneously formed with the same metal material, these components are formed in the same layer. For example, if a thin solid film made of a metal material is formed to cover the planarization layer 13 on the first substrate 10 and subjected to patterning by etching, the lower wires 14a, the connection wires 14b, the sealing metal portions 151, and the sealing metal layer 152 are simultaneously formed.

Then, in the display region 2 on the planarization layer 13, the barriers 16 are formed in a mesh between the lower wires 14a, between the lower wires 14a and the connection wires 14b, and on parts of the upper surfaces of the lower wires 14a and the connection wires 14b so as to form pixels. Then, the organic layers 17 are formed in the trenches between the barriers 16. The organic layers 17 may be formed by a vacuum deposition method or a printing method, for example. In this step, the contact holes 171 are formed in some of the organic layers 17.

Subsequently, the upper wires 18 are formed in stripe-shapes on the barriers 16 and the organic layers 17 to cross the lower wires 14a. In this step, parts of the upper wires 18 enter the contact holes 171 to be connected to the connection wires 14b.

Then, the sealing film 31 is formed on the upper wires 18. The sealing film 31 is formed in the display region 2, the first sealing region 3a, and the second sealing region 3c.

The first substrate 10 having the plurality of luminescent elements 170, the sealing film 31, and so forth formed thereon in the above-described manner and the second substrate 20 are bonded together with a thermoplastic epoxy resin and cured, to thereby produce the display panel 1.

Second Embodiment

A second embodiment relates to an active matrix type of organic EL display panel.

Figure 6:
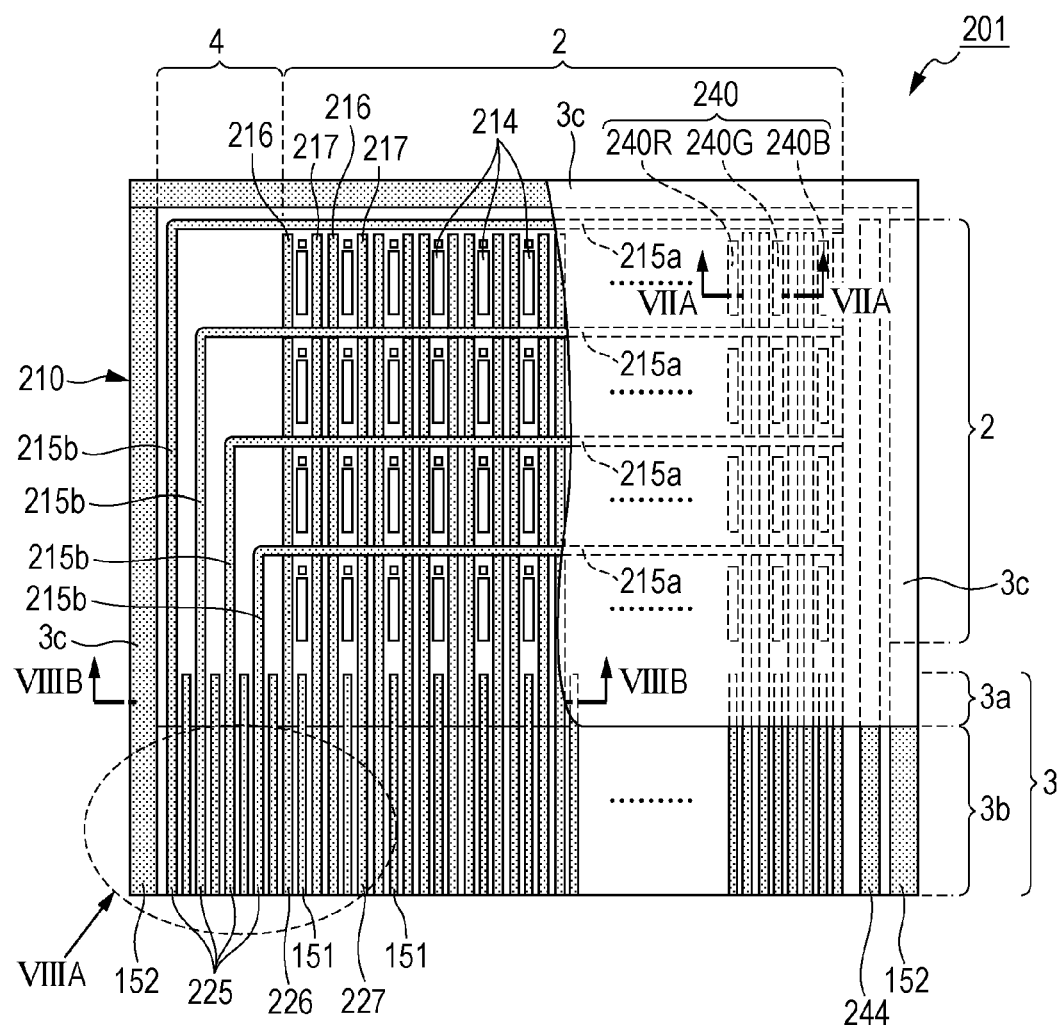
FIG. 6 is a plan view of a display panel according to a second embodiment.

FIG. 6 is a plan view of a display panel 201 according to the second embodiment. As illustrated in FIG. 6, in the display panel 201, a plurality of organic EL elements 240 are arranged in matrix in the display region 2 on a first substrate 210. The organic EL elements will hereinafter be abbreviated as the EL elements.

The EL elements 240 include red EL elements 240R, green EL elements 240G, and blue EL elements 240B. Three EL elements 240R, 240G, and 240B aligned adjacent to one another in the X direction form one pixel.

Figure 7A:
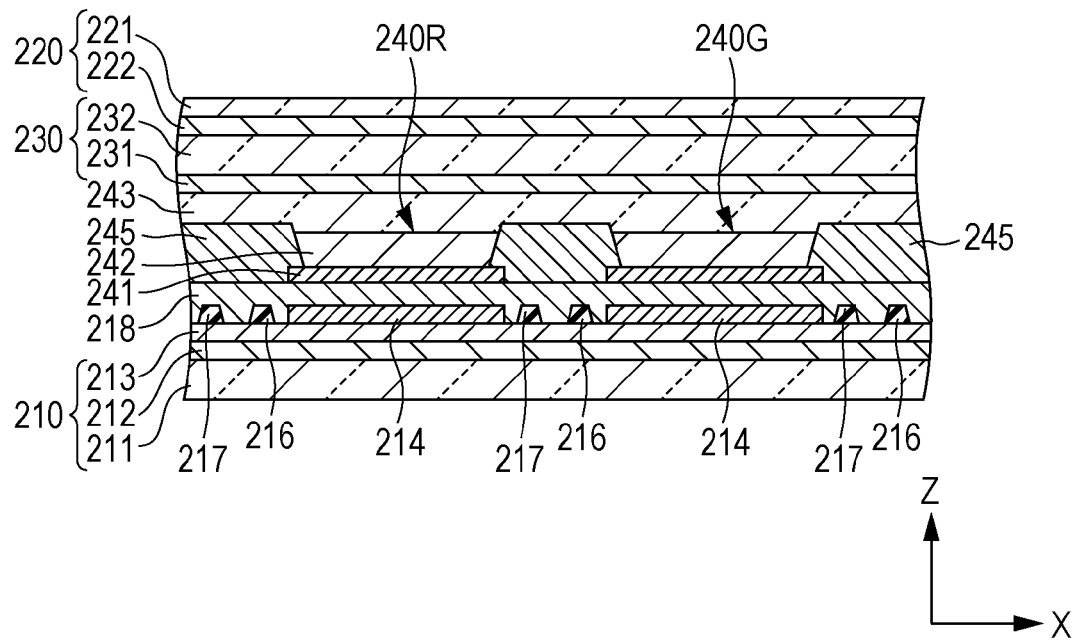
FIG. 7A is a cross sectional view of the display panel according to the second embodiment.
Figure 7B:
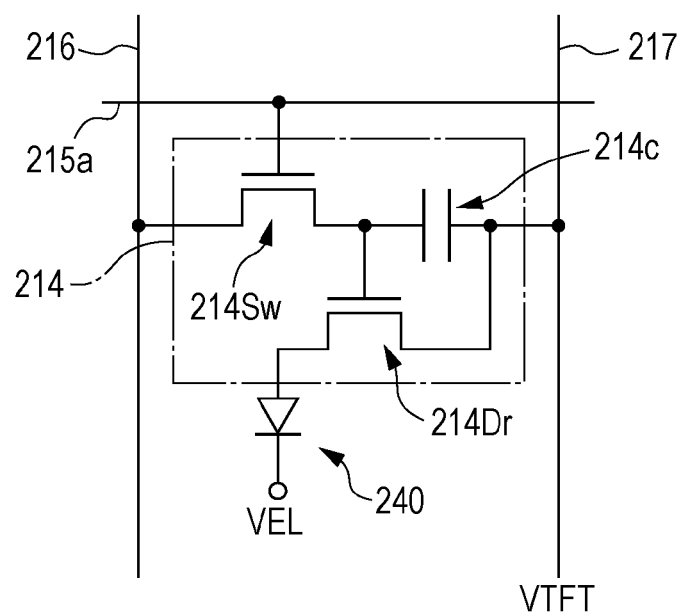
FIG. 7B is a wiring diagram illustrating a configuration of a device driving unit.

The left half of FIG. 6 illustrates arrangement of wiring and device driving units 214 for the EL elements 240 on the first substrate 210. FIG. 7A is a cross sectional view illustrating a structure of the EL elements 240 in the display panel 201, in which a cross section along line VIIA-VIIA in FIG. 6 is viewed in the direction of the corresponding arrows. FIG. 7B is a wiring diagram illustrating a configuration of the device driving unit 214. As illustrated in FIG. 7A, each of the EL elements 240 includes one electro luminescent unit having a laminate of a lower electrode 241, an organic layer 242, and an upper electrode 243 and one device driving unit 214 that drives the electro luminescent unit. The EL element 240 is of the top emission type. The device driving unit 214 is disposed on the first substrate 210, and the electro luminescent unit is disposed above the device driving unit 214.

As illustrated in FIG. 6, the plurality of device driving units 214 are arranged in matrix on the first substrate 210. Further, a plurality of gate lines 215a extending in the X direction are disposed as the second wiring group across the plurality of device driving units 214, and a plurality of data lines 216 and a plurality of source lines 217 extending in the Y direction are disposed as the first wiring group.

The first wiring group and the second wiring group are disposed to three-dimensionally cross each other, and the EL elements 240 are formed at respective locations at which the lower electrodes 241 and the upper electrode 243 three-dimensionally cross each other. Herein, the data lines 216 and the source lines 217 extending in the Y direction are disposed to sandwich the device driving units 214, and each of the device driving units 214 is faced by the corresponding gate line 215a, the corresponding data line 216, and the corresponding source line 217.

Further, in the region surrounding the display region 2 on the first substrate 210, the leader region 3 is provided outside in the opposite direction to the Y direction (on the lower side in FIG. 6) of the display region 2, and a connection wiring region 4 is provided outside in the opposite direction to the X direction (on the left side in FIG. 6) of the display region 2. Respective one ends of the plurality of gate lines 215a extend to the connection wiring region 4 and lead to gate connection lines 215b extending in the Y direction in the connection wiring region 4.

Further, in the connection wiring region 4, the plurality of gate connection lines 215b are disposed along the Y direction, and respective tip end portions thereof extend to the leader region 3. Respective portions of the gate connection lines 215b led out to the leader region 3 serve as leader lines 225.

Meanwhile, the plurality of data lines 216 and the plurality of source lines 217 extend from the display region 2 to the leader region 3. Further, respective portions of the data lines 216 led out to the leader region 3 serve as leader lines 226, and respective portions of the source lines 217 led out to the leader region 3 serve as leader lines 227.

All of the plurality of gate connection lines 215b, the plurality of data lines 216, and the plurality of source lines 217 thus extend in the Y direction, and the plurality of leader lines 225, 226, and 227 are formed parallel to one another (in stripe-shapes) in the leader region 3.

Further, a common leader line 244 is disposed on the right side of the display panel 201. The common leader line 244 is connected to the upper electrode 243 shared by all of the EL elements 240.

Details of the First Substrate 210 and the EL Elements 240

A detailed configuration of the first substrate 210 and the EL elements 240 will be described with reference to FIGS. 7A and 7B.

The first substrate 210 is formed of a substrate body 211 having a first barrier layer 212 formed thereon, and further includes a planarization layer 213 on the first barrier layer 212.

The substrate body 211, the first barrier layer 212, and the polarization layer 213 are similar to the substrate body 11, the first barrier layer 12, and the polarization layer 13 described in the first embodiment. The device driving units 214 are formed on the polarization layer 213. Further, a second insulating layer 218 made of an acrylic polymer is disposed to cover the plurality of device driving units 214 disposed on the polarization layer 213. The second insulating layer 218 is disposed in the display region 2 similarly to the polarization layer 213.

As illustrated in FIG. 7B, each of the device driving units 214 includes a driving transistor 214Dr for driving the corresponding EL element 240, a switching transistor 214Sw, and a capacitor (capacitance) 214C. The driving transistor 214Dr has a gate connected to a drain of the switching transistor 214Sw, a drain connected to the corresponding source line 217, and a source connected to the lower electrode 241 of the EL element 240.

Further, the switching transistor 214Sw has a gate connected to the corresponding gate line 215a, a source connected to the corresponding data line 216, and the drain connected to the capacitor 214C and the gate of the driving transistor 214Dr. The EL element 240 is formed on the second insulating layer 218. Respective components of the EL element 240 will be described.

The lower electrode 241 is provided separately for each of the EL elements 240, and is made of aluminum or a silver alloy. The lower electrode 241 is electrically connected to the drain electrode of the driving transistor 214Dr through a contact hole passing through the second insulating layer 218.

The organic layer 242 includes a luminescent layer made of an organic luminescent material. The organic layer 242 is formed on the lower electrode 241, and the respective organic layers 242 of adjacent two of the EL elements 240 are divided by a barrier 245.

The organic layers 242 and the barriers 245 are similar in configuration to the organic layers 17 and the barriers 16 described in the first embodiment.

The upper electrode 243 is a transparent electrode made of ITO or the like, and covers the entirety of the organic layers 242 and the barriers 245. The upper electrode 243 is a common electrode shared by all of the EL elements 240.

Components of the display panel 201 located above the upper electrode 243 are similar in configuration to those of the first embodiment. A second substrate 220 is laminated on the upper electrode 243 via a sealing layer 230.

The sealing layer 230 includes a sealing film 231 directly covering the upper electrode 243 and a resin layer 232 covering the sealing film 231. The sealing layer 230 covers the display region 2, the first sealing region 3a, and the second sealing region 3c on the first substrate 210.

The sealing layer 230 in the display region 2 and the sealing layer 230 in the first sealing region 3a may be the same layer. With this configuration, the sealing layer covering the plurality of display elements and the sealing layer adhering to the plurality of leader lines 225, 226, and 227 and the sealing metal portions 151 are not separated from each other. Accordingly, the sealing property is improved, and a failure factor such as moisture is effectively prevented from permeating the display region 2 from the leader region 3.

The sealing film 231 is similar in configuration to the sealing film 31 described in the first embodiment. The sealing film 231 is made of an inorganic material (silicon nitride). The sealing film 231 suppresses the permeation of moisture, gases, and so forth into the EL elements 240 from the outside.

The second substrate 220 is similar in configuration to the second substrate 20 described in the first embodiment. The second substrate 220 includes a substrate body 221 and a second barrier layer 222 staked on the lower surface of the substrate body 221, and covers the region on the first substrate 210 excluding the mount region 3b.

Driving of the Display Panel 201

When the display panel 201 is driven, a data voltage (positive voltage) is applied to the plurality of leader lines 226, while a gate voltage (positive voltage) is sequentially applied to the plurality of leader lines 225 from the outside. Thereby, the gate voltage is sequentially applied to the plurality of gate lines 215a, and the data voltage is applied to the plurality of data lines 216.

Herein, the gate lines 215a are maintained at a negative potential when not applied with the gate voltage. Further, the data voltage has different magnitudes for the individual data lines 216 in accordance with image data intended to be displayed.

Further, in each of the device driving units 214 connected to the gate lines 215a applied with the gate voltage, the switching transistor 214Sw is brought into the on state, and the data voltage supplied via the data lines 216 is held by the capacitor 214C.

Then, with the common leader line 244 connected to ground or maintained at a negative potential, and with a potential (VEL) of the upper electrode 243 connected to the common leader line 244 also maintained at a ground or negative potential, a positive voltage (VTFT) is applied to the leader lines 227 at the same time from the outside, to thereby supply drive electric power. Thereby, a drive current flows through the EL elements 240 via the respective driving transistors 214Dr of the device driving units 214 through the source lines 217, and then flows into the common leader line 244 from the upper electrode 243.

In this process, a hold voltage held by the above-described capacitor 214C causes an analog change in the conductance of the driving transistor 214Dr. Therefore, the magnitude of the drive current flowing through the EL element 240 also changes in accordance with the hold voltage held by the capacitor 214C.

With the above-described operation, the respective EL elements 240 emit light with luminescent gradation according to the image data, and one frame of image is displayed in the display region 2 of the display panel 201.

A Configuration of the First Sealing Region 3a and the Second Sealing Region 3c

FIG. 8A is an enlarged view of wiring in a region enclosed by broken line VIIIA in FIG. 6. FIG. 8B is a cross sectional view along line VIIIB-VIIIB of the first sealing region 3a in the display panel 201 illustrated in FIG. 6, as viewed in the direction of the corresponding arrows.

As illustrated in FIGS. 8A and 8B, in the leader region 3, the plurality of leader lines 225, 226, and 227 extending in the Y direction are formed parallel to one another (in stripe-shapes) on the first substrate 210. Further, the sealing metal portions 151 electrically separated from the leader lines 225, 226, and 227 are disposed in gaps between the leader lines 225, a gap between the leader lines 225 and the leader lines 226, and gaps between the leader lines 226 and the leader lines 227.

The plurality of sealing metal portions 151 are stripe-shaped and extend in the Y direction parallel to the leader lines 225, 226, and 227. Further, a gap is ensured between each of the sealing metal portions 151 and any of the leader lines 225, 226, and 227 adjacent thereto in order to electrically separate the sealing metal portion 151 from the leader lines 225, 226, and 227.

Further, as illustrated in FIG. 8B, the sealing layer 230 including the sealing film 231 and the resin layer 232 is laminated in the first sealing region 3a.

The sealing film 231 is similar in configuration to the sealing film 31 described in the first embodiment. The sealing film 231 covers the display region 2 on the first substrate 210, and covers and adheres to the leader lines 225, 226, and 227 and the sealing metal portions 151 in the first sealing region 3a of the leader region 3 on the side of the display region 2. Further, parts of the sealing film 231 enter and fill the gaps between the leader lines 225, the gap between the leader lines 225 and the leader lines 226, and the gaps between the leader lines 226 and the leader lines 227.

As described above, in addition to the leader lines 225, 226, and 227, the sealing metal portions 151 are disposed in the first sealing region 3a, and the sealing film 231 adheres to and covers the sealing metal portions 151 and the leader lines 225, 226, and 227. Therefore, the sealing property in the first sealing region 3a is improved, as described in the first embodiment. In the example illustrated in FIG. 6, one sealing metal portion 151 is disposed in each of the gaps between the leader lines 225, the gap between the leader lines 225 and the leader lines 226, and the gaps between the leader lines 226 and the leader lines 227. However, the number of sealing metal portions 151 disposed in each of these gaps may be two or more.

Further, similarly to the first embodiment, the sealing metal layer 152 is disposed on the first substrate 210 in the second sealing region 3c in the region surrounding the display region 2, which corresponds to the three sides of the display region 2 other than the side of the display region 2 from which the leader lines 225, 226, and 227 are led out, as illustrated in FIG. 6. The sealing metal layer 152 is formed on the first substrate 210 to be electrically separated from the leader lines 225, 226, and 227. Further, as illustrated in FIGS. 8A and 8B, a rim of the sealing film 231 adheres to and covers the sealing metal layer 152. Accordingly, the sealing property is also improved in the second sealing region 3c.

Similarly to the first embodiment, the sealing metal portions 151 may be formed at least in the first sealing region 3a, and are not required to extend to the mount region 3b as illustrated in FIG. 6. With the sealing metal portions 151 formed at least in the first sealing region 3a, a failure factor such as moisture is effectively prevented from permeating the display region 2 from the surroundings thereof.

Modified Examples

1. In the foregoing first and second embodiments, there are a plurality of gaps between adjacent ones of the leader lines in the first sealing region 3a, and the sealing metal portions 151 are disposed in the gaps. However, the sealing metal portions 151 may not be disposed in all of the gaps. That is, if there are a plurality of gaps between adjacent ones of the leader lines in the first sealing region 3a, and if a sealing metal portion 151 is disposed in at least one of the plurality of gaps, the sealing property is improved in the portion in which the sealing metal portion 151 is disposed.

To enhance the effect of the sealing property, a sealing metal layer may be disposed in a large gap between leader lines.

2. In the foregoing first and second embodiments, a plurality of display elements are disposed on the first substrate, and the sealing layer and the second substrate are disposed on the display elements. However, the second substrate is not necessarily required. In this case, the permeation of moisture and so forth from the outside is suppressed by the sealing layer. Further, in this case, the first sealing region 3a and the second sealing region 3c are implementable similarly to those of the foregoing embodiments, and similar effects to those of the foregoing embodiments are obtainable.

3. In the display devices according to the foregoing first and second embodiments, a plurality of leader lines are disposed only in the first sealing region 3a corresponding to one side of the display region 2. Even if a plurality of leader lines are disposed in regions corresponding to two or more sides of the display region 2 including the first sealing region 3a and the second sealing region 3c, however, the sealing property is similarly improved in gaps between the leader lines in which sealing metal layers are disposed.

4. In the foregoing first and second embodiments, the sealing layer covers the entire plurality of display elements. However, the sealing layer is not necessarily required to cover the plurality of display elements.

For example, if the first embodiment uses glass substrates as the first and second substrates and uses glass frit as a sealing layer for sealing the space between the glass substrates in the surrounding leader region 3, and if the sealing layer is provided to adhere to the leader lines 141a and 141b, the sealing property of the panel is ensured even if the display region 2 is not covered by the sealing layer.

Also in such a display device, the sealing property is improved by disposing the sealing metal portions 151 between the leader lines 141a and between the leader lines 141a and the leader lines 141b with the sealing metal portions 151 electrically separated from the leader lines 141a and 141b.

5. In the foregoing first embodiment, the sealing layer 30 (the sealing film 31) directly adheres to the leader lines 141a and 141b and the sealing metal portions 151 in the first sealing region 3a. In the first sealing region 3a, however, another sealing layer may be interposed between the sealing layer 30 and the leader lines 141a and 141b and the sealing metal portions 151, and the another sealing layer may adhere to the leader lines 141a and 141b and the sealing metal portions 151. In this case, a sealing layer combining the sealing layer 30 and the another sealing layer adheres to and seals the leader lines 141a and 141b and the sealing metal portions 151, and thus the sealing property improvement effect is similarly obtained.

6. FIG. 8C is a diagram illustrating a modified example of the sealing metal portions 151. The sealing metal portions 151 according to the first embodiment may have a cross sectional structure as in FIG. 8C. The modified example is similar in configuration to the display panel 1 according to the first embodiment except that a metal layer 153 extending in the X direction is formed on the sealing films 31 in the first sealing region 3a, and that the plurality of sealing metal portions 151 are electrically connected by the metal layer 153.

With this configuration, the plurality of sealing metal portions 151 are maintained at the same potential. Further, if one of the plurality of sealing metal portions 151 is connected to ground, the entire plurality of sealing metal portions 151 are connected to ground.

Also in this modified example, the sealing films 31 adhere to the leader lines 141a and 141b and the sealing metal portions 151, and parts of the sealing films 31 enter the gaps between the leader lines 141a and the sealing metal potions 151 and the gaps between the leader lines 141b and the sealing metal portions 151. Further, the sealing metal portions 151 are electrically separated from the leader lines 141a and 141b.

Also in this modified example, the sealing property in the first sealing region 3a is similarly improved. Further, in this modified example, another sealing film 31 may further be disposed to cover the metal layer 153.

7. In the display devices according to the foregoing first and second embodiments, the wiring groups disposed in the display region 2 on the first substrate form the leader lines led out to the surrounding leader region 3. Alternatively, a driver or the like for driving the display elements may be provided on the first substrate, and wires may be led out from the driver to form the leader lines.

Figure 9:
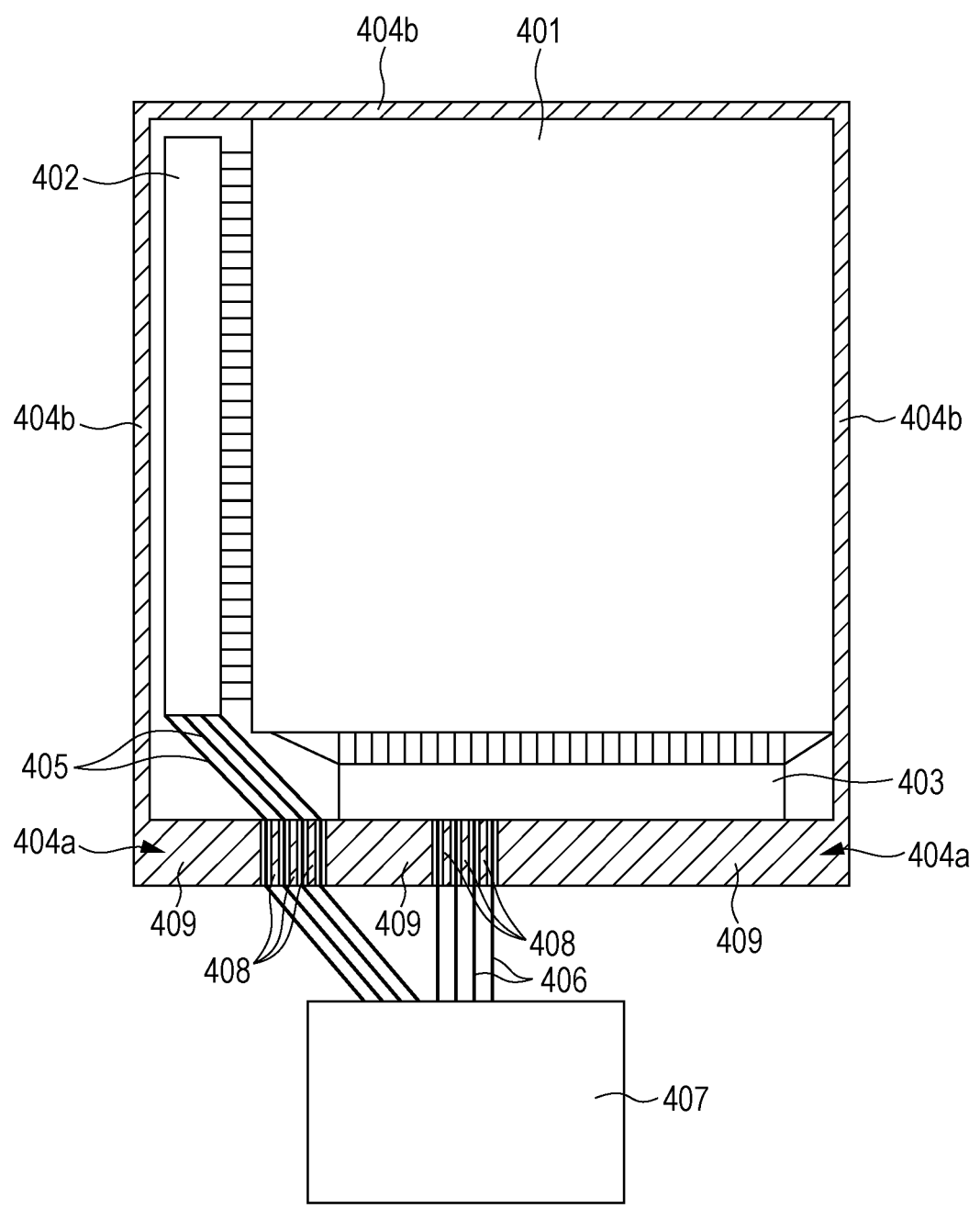
FIG. 9 is a diagram illustrating a configuration of a display panel according to a modified example.

In a display device illustrated in FIG. 9, a plurality of display elements and wiring groups are disposed in a display region 401 on a substrate, and a gate driver 402 and a source driver 403 are provided in the surroundings of the display region 401. Further, a first sealing region 404a and a second sealing region 404b are provided in a region surrounding the panel to surround the outside of the gate driver 402 and the source driver 403.

Leader lines 405 and 406 led out from the gate driver 402 and the source driver 403 to the first sealing region 404a are connected to a controller 407 located outside the panel. In the first sealing region 404a and the second sealing region 404b, a sealing layer is formed to adhere to the leader lines 405 and 406. In portions of the first sealing region 404a to which the plurality of leader lines 405 and 406 are led out, sealing metal portions 408 electrically separated from the leader lines 405 and 406 are disposed in gaps between adjacent ones of the leader lines 405 and 406.

Further, sealing metal layers 409 electrically separated from the leader lines 405 and 406 are disposed in the remaining portions of the first sealing region 404a other than the portions to which the leader lines 405 and 406 are led out and in the second sealing region 404b to which no leader lines are led out. Further, a sealing layer is provided to adhere to the sealing metal portions 408 and the sealing metal layers 409.

Also in such a display device, the sealing property is improved in the portions of the first sealing region 404a in which the sealing metal portions 408 and the sealing metal layers 409 are disposed, similarly as described in the first and second embodiments.

Other drivers or convertors, for example, may be disposed on the substrate in place of the gate driver 402 and the source driver 403. A display device having such a configuration is similarly implementable.

8. In the foregoing embodiments, the description has been given of an example of an organic EL panel, in which the metal portions are disposed between adjacent ones of the leader lines. However, the display device is not limited to the organic EL panel, and a display device which includes a plurality of display elements in a display region on a substrate, and in which leader lines are provided in a region surrounding the display region and sealed by a sealing layer is similarly implementable.

For example, also in a display device that has a plurality of self luminescent elements, such as inorganic EL elements, on a substrate and displays the image by passive driving or active driving, the sealing property of the display device is similarly improved by forming sealing metal portions between adjacent leader lines.

Further, also in a liquid crystal display device that includes a plurality of liquid crystal display elements on a substrate and displays the image by passive driving or active driving, the effect of improving the sealing property of the display device is similarly obtained by forming sealing metal portions between leader lines.

INDUSTRIAL APPLICABILITY

A display device according to the present disclosure is applicable to a variety of display devices, such as an organic EL display device and a liquid crystal display device.

What is claimed is:

1. A display device comprising:
a first substrate;
a plurality of display elements disposed on the first substrate;
a plurality of leader lines led out from a display region on the first substrate, the plurality of display elements being disposed in the display region, to a leader region in surroundings of the display region, and used to input at least one of a display signal and drive electric power from outside the display device to the plurality of display elements;
a sealing layer covering the plurality of display elements in the display region, and covering the plurality of leader lines and the first substrate in a first sealing region of the leader region adjacent to the display region; and
a plurality of metal portions electrically separated from the plurality of leader lines, and disposed in the first sealing region between adjacent two of the plurality of leader lines with gaps that are formed between each of the plurality of the metal portions and each of the adjacent two of the plurality of leader lines, a part of the sealing layer filling the gaps and adhering to each of the plurality of the metal portions in the first sealing region.

2. The display device according to claim 1, wherein the sealing layer in the display region and the sealing layer in the first sealing region are a same layer.

3. The display device according to claim 1, wherein at least one of the plurality of the metal portions is disposed between each adjacent two of the plurality of leader lines in the first sealing region.

4. The display device according to claim 1, wherein the plurality of the metal portions are formed at least in the first sealing region.

5. The display device according to claim 1, wherein, when the first substrate is viewed from above, the plurality of leader lines are disposed parallel to each other, and each of the plurality of the metal portions has a stripe-shape and extends parallel to the adjacent two of the plurality of leader lines.

6. The display device according to claim 1, wherein the plurality of leader lines and the plurality of the metal portions are formed in a same layer on the first substrate.

7. The display device according to claim 1, wherein portions of the sealing layer adhering to the leader lines and the plurality of the metal portions are made of an inorganic material.

8. The display device according to claim 1, wherein portions of the sealing layer covering the plurality of display elements are made of an inorganic material.

9. The display device according to claim 1, wherein at least one of the plurality of the metal portions is electrically connected to a terminal having a constant potential.

10. The display device according to claim 1, further comprising a first wiring group and a second wiring group formed to three-dimensionally cross the first wiring group, the first wiring group and the second wiring group provided in the display region on the first substrate,
wherein the plurality of display elements are formed at respective locations at which the first wiring group and the second wiring group three-dimensionally cross each other, and
wherein at least one of the first wiring group and the second wiring group is led out to the leader region in the surroundings of the display region to form the plurality of leader lines.

11. The display device according to claim 10, wherein the display region has a rectangular shape, and
wherein the plurality of leader lines are led out from one side of the display region.

12. The display device according to claim 11, further comprising connection wires extending parallel to the first wiring group,
wherein the second wiring group includes wires connected to the connection wires, and
wherein the plurality of leader lines include leader lines led out from the first wiring group, and include leader lines led out from the connection wires.

13. The display device according to claim 11, wherein the surroundings of the display region other than the leader region includes a second sealing region,
wherein the display device further comprises a metal layer electrically separated from the plurality of leader lines and disposed in the second sealing region on the first substrate, and
wherein the sealing layer adheres to the metal layer.

14. The display device according to claim 1, further comprising a first wiring group and a second wiring group formed to three-dimensionally cross the first wiring group, the first wiring group and the second wiring group provided in the display region on the first substrate,
wherein the plurality of display elements are formed at respective locations at which the first wiring group and the second wiring group three-dimensionally cross each other, and
wherein the display device further comprises a driver connected to at least one of the first wiring group and the second wiring group to lead the plurality of leader lines out to the first sealing region from the driver.

15. The display device according to claim 1, further comprising a second substrate arranged opposite to the first substrate to cover the sealing layer.

16. The display device according to claim 15, wherein the first substrate and the second substrate are flexible.

17. The display device according to claim 16,
wherein each of the first substrate and the second substrate comprises a substrate body formed of a plastic film, and a barrier layer formed on the upper surface of the substrate body, the barrier layer preventing moisture from permeating from the outside to the inside of the substrate body.

18. The display device according to claim 17, wherein at least a part of the barrier layer is made of a same material as a material forming the sealing layer.

* * * * *